United States Patent [19]
Liao

[11] Patent Number: 6,122,822
[45] Date of Patent: Sep. 26, 2000

[54] METHOD FOR BALANCING MOLD FLOW IN ENCAPSULATING DEVICES

[75] Inventor: Kuang-Ho Liao, Sulin, Taiwan

[73] Assignee: Vanguard International Semiconductor Corporation, Hsin Chu, Taiwan

[21] Appl. No.: 09/103,193

[22] Filed: Jun. 23, 1998

[51] Int. Cl.⁷ .................................................. H01R 43/00
[52] U.S. Cl. ............................................ 29/827; 174/52.2
[58] Field of Search ............................... 29/827, 328.12, 29/272.17; 174/52.2, 52.1

[56] References Cited

U.S. PATENT DOCUMENTS

| | | | |
|---|---|---|---|
| 4,177,480 | 12/1979 | Hintzmann et al. | 357/84 |
| 4,761,518 | 8/1988 | Butt et al. | 174/52 FP |
| 5,049,527 | 9/1991 | Merrick et al. | 437/220 |
| 5,096,853 | 3/1992 | Yasunaga et al. | 437/216 |
| 5,197,183 | 3/1993 | Chia et al. | 29/827 |
| 5,406,699 | 4/1995 | Oyama | 29/827 |
| 5,428,248 | 6/1995 | Cha | 257/676 |
| 5,577,319 | 11/1996 | Knecht | 29/827 |
| 5,614,441 | 3/1997 | Hosokawa et al. | 437/207 |
| 5,692,296 | 12/1997 | Variot | 29/827 |

*Primary Examiner*—Lee Young
*Assistant Examiner*—Kevin G. Vereene
*Attorney, Agent, or Firm*—Tung & Associates

[57] ABSTRACT

A method for forming a plastic package of an electronic device that is substantially without void formation is disclosed. In the method, a lead finger which is to be encapsulated in a plastic package is first deformed into various configurations such that the mold flow pattern can be modified accordingly. For instance, the tip portion of the lead finger can be formed into a U-shaped or a V-shaped bend, can be tilted to a 45° slope or can be formed with U-shaped or V-shaped notch in the lead finger such that plastic flow velocity may be increased where the flow channel has been enlarged. Numerous embodiments of the present invention novel method are available for achieving similarly desirable results.

15 Claims, 3 Drawing Sheets

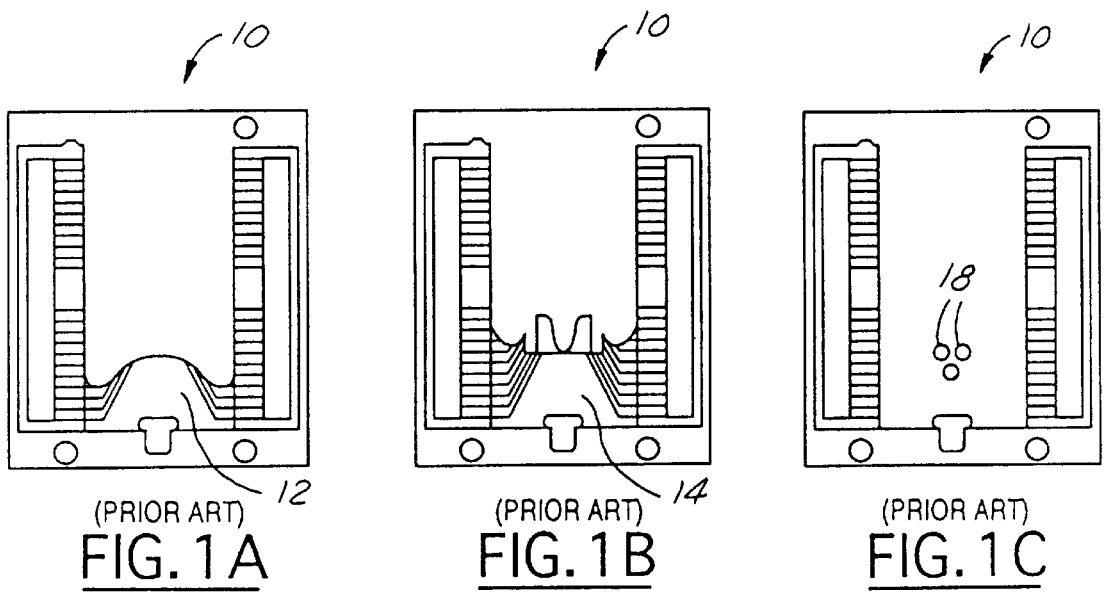
(PRIOR ART)
FIG. 1A
(PRIOR ART)
FIG. 1B
(PRIOR ART)
FIG. 1C
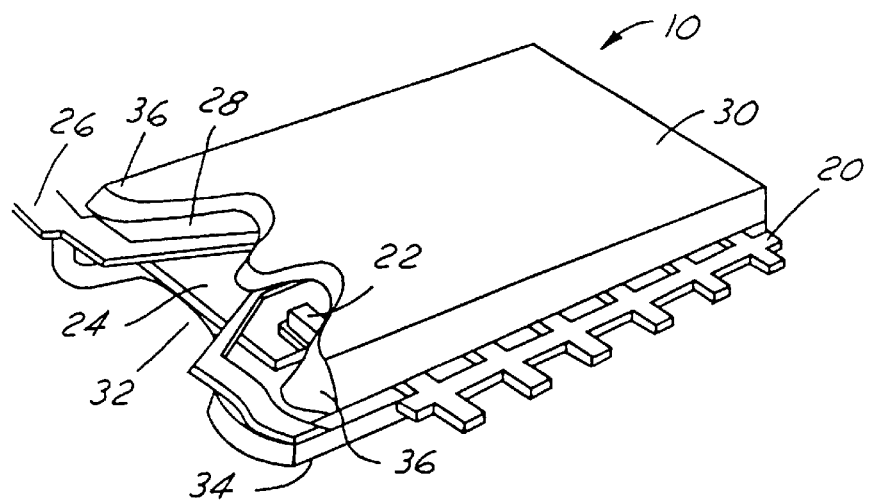
(PRIOR ART)
FIG. 1D

METHOD FOR BALANCING MOLD FLOW IN ENCAPSULATING DEVICES

FIELD OF THE INVENTION

The present invention generally relates to a method for balancing mold flow in a process for plastic encapsulation of IC devices and more particularly, relates to a method for forming a plastic package of an electronic device without voids by deforming a portion of lead fingers to be encapsulated in the plastic package such that a first flow channel formed between a top surface of a lead finger and a top interior mold surface is substantially balanced to a second flow channel formed between a bottom surface of the lead finger and a bottom interior mold surface.

BACKGROUND OF THE INVENTION

The packaging of semiconductor chips is an important step in the total chip fabrication process. The purposes of packaging is to provide electrical connection, to expand the chip electrode pitch for the next level packaging, to protect the chip from mechanical and environmental stress, and furthermore, to provide a proper thermal path for the heat that the chip dissipates.

One of the more popularly utilized packaging techniques is the plastic package. A plastic package can be produced by an automated injection molding process and can be very cost competitive. In a typical plastic package, a chip is attached to the paddle portion of a lead frame. The lead frame which is made of etched or stamped thin metal of typically iron-nickel or copper alloys, serves as an outer frame around which the package can be assembled. The lead frame further provides external leads in a completed package. Interconnections can be achieved by fine gold wire between the lead fingers and the bond pads on an IC device. A plastic encapsulation process can be carried out in a transfer molding method by utilizing typically an epoxy resin. The epoxy resin encapsulates the IC chip and forms the peripheral shape of the package at the same time. The external leads can be formed into their final shape after the plastic molding process is completed. A typical plastic package therefore is a composite structure consisting of a silicon chip, a metal lead frame and a plastic molding compound. The chip support paddle and the inner tips of the lead fingers are silver plated, while the external leads are solder coated after the molding process is completed.

A more recently developed plastic package for IC chips is the lead-on-chip (LOC) package. In a LOC package, both the lead frame and the bonding wires are positioned on top of the IC circuit. LOC package is used in modern high density memory devices wherein a plurality of lead fingers are disposed on and attached to an active surface of an IC chip. A major benefit provided by the LOC package is that the ratio between the size of the IC chip and the size of the package is significantly higher than conventional packages since the mounting area, i.e., the die pads, is no longer required in a LOC package. The high ratio between the chip size and the package size is very desirable in the ever increasing miniaturization of IC devices. In a LOC package, a metal lead frame substantially covers the active devices of the chip, it is therefore more difficult to perform a failure analysis on the top surface of a LOC package.

In the molding of a plastic package, the flow pattern of a plastic melt in a mold must be carefully controlled in order to produce a quality product. Difficulty arises when an IC chip and a lead frame is positioned in a mold cavity which has a very small gap from the mold surface. The flow channel for the plastic is very small and thus the lay out of the chip/lead frame in relation to the mold must be carefully designed. When the mold flow during a molding process is inadequate, plastic packages containing large voids are produced. These packages must be scrapped when the void content is significant. The void formation in a plastic package not only affects the thermal conductivity of the plastic, but also serves as a moisture trap which collects moisture which is detrimental to both the metal bond pads on the chip and the epoxy packaging material. The void formation in plastic packages are sometimes caused by a poorly designed mold flow pattern which traps air easily on the top or bottom side of the chip.

A conventional plastic package that contains large void formation is shown in FIGS. 1A~1D. As shown in FIG. 1A, plastic package 10 is on its bottom side which indicates a large void formation 12 with essentially no plastic coverage. On the top side of the package 10, a large void 14 also present due to a short shot, or trapped air during the molding process. This is shown in FIG. 1B. Another conventional plastic package 10 is shown in FIG. 1C with voids 18 caused by trapped air. FIG. 1D shows a perspective view of a plastic package 10 which has insufficient coverage after a plastic molding process. The plastic package 10 is a lead-on-chip package which consists of a dam-bar 20, lead fingers 22, chip 24 and an outer frame 26. The LOC package 10 shows a large void formation 28 on a top surface 30 and a large void formation 32 on a bottom surface 34. The void formation 28, 32 are mainly caused by trapped air and inadequate flow channel design. It is noted that the plastic flow velocity along the edges 36 of the package is faster than the center of the package and thus causing void formation. The balancing of mold flow for encapsulating a semiconductor chip is therefore an important aspect of the packaging process.

It is therefore an object of the present invention to provide a method for forming a plastic package of an electronic device without the drawbacks and shortcomings of the conventional methods.

It is another object of the present invention to provide a method for forming a plastic package of an electronic device without void formation that can be carried out by the same processing equipment used in conventional methods.

It is a further object of the present invention to provide a method for forming a plastic package of an electronic device without void formation wherein a semiconductor chip and a lead frame are encapsulated in an injection molded plastic material.

It is another further object of the present invention to provide a method for balancing mold flow in encapsulating IC devices by first providing a lead frame and then deforming the lead fingers to improve the flow pattern in the mold.

It is still another object of the present invention to provide a method for balancing mold flow in encapsulating IC devices by first providing a lead frame and then deforming lead fingers of the lead frame such that, after the device and the lead frame are loaded into a mold cavity, a flow channel above the lead frame and a flow channel below the lead frame are substantially the same.

It is yet another object of the present invention to provide a method for balancing mold flow in encapsulating IC devices by utilizing a lead frame wherein the lead fingers are deformed into a U or V-shaped bend for improving plastic flow in the mold.

It is still another further object of the present invention to provide a method for balancing mold flow in encapsulating IC devices by providing a lead frame and then deforming the lead fingers into fingers having sloped planes such that the flow channel can be modified.

It is yet another further object of the present invention to provide a method for balancing mold flow in encapsulating IC devices by first providing a lead frame which has lead fingers that are deformed into V or U-shaped notches to modify the flow pattern in the mold.

SUMMARY OF THE INVENTION

In accordance with the present invention, a method for forming a plastic package of an electronic device that is substantially without void formation is provided.

In a preferred embodiment, the method for forming a plastic package of an electronic device substantially without void formation can be carried out by the steps of first providing a lead frame that has an outer frame and a plurality of lead fingers, the lead fingers are formed substantially in the same plane as the outer frame, deforming a portion of the lead fingers to be encapsulated in a plastic package, such that when the lead fingers are subsequently positioned in a mold cavity, a first flow channel formed between the deformed lead finger and a first interior mold surface is closer in size to a second flow channel formed between the deformed lead finger and a second interior mold surface situated opposite to the first interior mold surface than before the lead finger is deformed, positioning the lead frame with the deformed lead fingers and an electronic device in a mold cavity, and flowing a plastic flow into the mold cavity to encapsulate the deformed lead fingers and the electronic device, wherein the deformed lead fingers enable more balance plastic flow to substantially eliminate the formation of voids.

The electronic device and the deformed lead fingers are normally in electrical communication with each other. A first plastic flow velocity formed in the first flow channel is substantially similar to a second plastic flow velocity in a second flow channel. The first interior mold surface and the second interior mold surface are substantially parallel. The plurality of lead fingers emanating from the outer frame extends inwardly away from the outer frame.

The method may further include the step of deforming the lead fingers by forming an U-shaped bend in the lead fingers with an opening of the U facing a flow channel in which the plastic flow velocity is to be increased. The method may further include the step of deforming the lead fingers by forming a V-shaped bend in the lead fingers with an opening of the V facing a flow channel in which the plastic flow velocity is to be increased. The method may further include the step of deforming the lead fingers by tilting a plane of the finger to about 45° toward a flow channel in which a plastic flow velocity is to be increased. The method may further include the step of deforming the lead fingers by forming an U-shaped or V-shaped notch in the lead fingers with an opening of the U or the V facing a flow channel in which the plastic flow velocity is to be increased. The method may further include the step of mounting a tip of the lead finger to a surface of an IC chip containing bond pads by an adhesive tape. The present invention is further directed to a plastic package of an electronic device that is formed by the above described method.

In another preferred embodiment, a method for balancing mold flow in encapsulating IC devices can be carried out by the steps of first providing a lead frame that has a plurality of lead fingers emanating from an outer frame and extending inwardly away from the outer frame, deforming a portion of the lead fingers to be encapsulated in a plastic package such that a first flow channel formed between a top surface of a lead finger and a top interior mold surface is substantially balanced to a second flow channel formed between a bottom surface of a lead finger and a bottom interior mold surface, positioning the lead frame and an IC device in a mold cavity, and injecting a plastic flow into the mold cavity for encapsulating the deformed lead fingers and the IC device.

The balanced plastic flow in the first and second flow channels substantially eliminate the formation of voids caused by unbalanced plastic flow in the mold. The plurality of lead fingers are formed in the same plane as the outer frame of the lead frame. The formation of voids is believed to be caused by trapped air in the mold. A first plastic flow velocity in the first flow channel is substantially similar to a second plastic flow velocity in the second flow channel. The top interior mold surface and the bottom interior mold surface are substantially parallel to each other.

The method may further include the step of deforming the lead fingers by forming a U or V-shaped bend in the lead fingers with the opening of the U or V facing a flow channel in which the plastic flow velocity is to be increased. The method may further include the step of deforming the lead fingers by tilting a plane of the finger to about 45° toward a flow channel in which a plastic flow velocity is to be increased. The method may further include the step of deforming the lead fingers by forming an U or V-shaped notch in the lead fingers with an opening of the U or V facing a flow channel in which the plastic flow velocity is to be increased. The present invention is further directed to an IC device encapsulated in a plastic package according to the above described method.

BRIEF DESCRIPTION OF THE DRAWINGS

These objects, features and advantages will become apparent by the following specification and the appended drawings in which:

FIG. 1A is an enlarged, plane view of a conventional LOC package showing void formation on a top side of the package.

FIG. 1B is an enlarged, plane view of a conventional LOC package showing void formation on the bottom side of the package.

FIG. 1C is an enlarged, plane view of a conventional LOC package showing air inclusions surrounded by the plastic.

FIG. 1D is an enlarged, perspective view of a conventional LOC package having void formation at both the top and the bottom side.

DETAILED DESCRIPTION OF THE PREFERRED EMBODIMENT

The present invention provides a method for forming a plastic package of an electronic device without void formation by utilizing a lead frame that has deformed lead fingers such that plastic flow package in the mold can be improved to provide a more balanced flow in the mold and thus avoid trapped air and void formation. The tip portion of the lead fingers can be deformed in a variety of patterns such as a U or V-shaped bend, a 45° slope of the lead finger plane or a U or V-shaped notch formed in the lead fingers. The various deformed lead fingers facilitate plastic flow in a predetermined direction such that the flow front in the mold can be balanced to avoid void formation. Typical problems caused by an unbalanced flow wherein plastic flows faster in a flow channel formed between the package edge and a dam-bar can thus be avoided.

The present invention novel method guides a plastic flow into slower resin flow areas. In other words, the present invention novel method diverts plastic flow from a lower pressure area to a higher pressure area. It has been demonstrated that in order to enhance a plastic flow in a TSOP (thin small outline package) package of the LOC structure, the inner leads should be made closer to the top surface of the chip. The mold channel above the lead fingers around the chip area should be enlarged. Since a character of the TSOP package is its small thickness, a few changes made in the lead finger position or shape reduce the flow resistance when the plastic flow passes the chip area. It should be noted that while only a few variations in the lead finger configuration is illustrated in the present invention, any other configuration that enhances plastic flow in a predetermined area can be adapted in the present invention method.

Figure 2A:
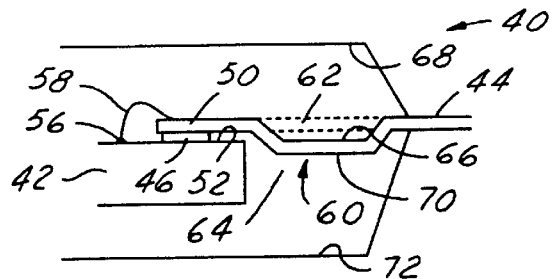
FIG. 2A is an enlarged, cross-sectional view of a present invention LOC package showing a U-shaped bend for improving mold flow above the lead finger.

Referring initially to FIG. 2A, wherein an enlarged, cross-sectional view of a present invention LOC package 40 is shown. The LOC package 40 encapsulates an IC device 42 and a lead finger 44. A tape 46 is used to bond the tip 50 of the lead finger 44 to an upper surface 52 of the chip 42. The tape may be selected from any suitable commercially available adhesive tapes. The tip 50 of the lead finger 44 is connected to a bond pad 56 on the top surface 52 of the chip by a gold wire 58.

In this embodiment, a U-shaped bend 60 is first formed in the lead finger 44 such that a larger flow channel 62 which is substantially equivalent to flow channel 64 is achieved. It should be noted that flow channel 62 is formed between a top surface 66 of the lead finger 44 and a top interior mold surface 68, while the flow cannel 64 is formed between a bottom surface 70 of the lead finger 44 and a bottom mold surface 72. The U-shaped bend 60 formed in the lead finger 44 enhances plastic flow above the lead finger, and thereby balancing mold flows above and below the lead finger 44.

Figure 2B:
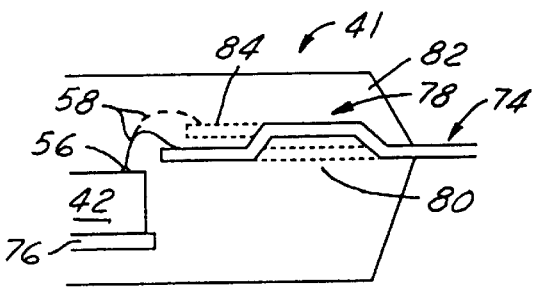
FIG. 2B is an enlarged, cross-sectional view of a present invention non-LOC package showing an inversed U-shaped bend for allowing more plastic flow under the lead finger.

A second embodiment of the present invention novel method is shown in FIG. 2B. In the present invention non-LOC package 41, the IC chip 42 is bonded to a die pad 76. The lead finger 74 is deformed into an inversed U-shaped bend 78 to allow a larger flow passage 80 under the lead finger 74 than the flow passage 82 over the lead finger 74. The mold flow pattern is therefore balanced by the adjustment in the relative cross-sectional flow passages under and over the lead finger 74.

Figure 2C:
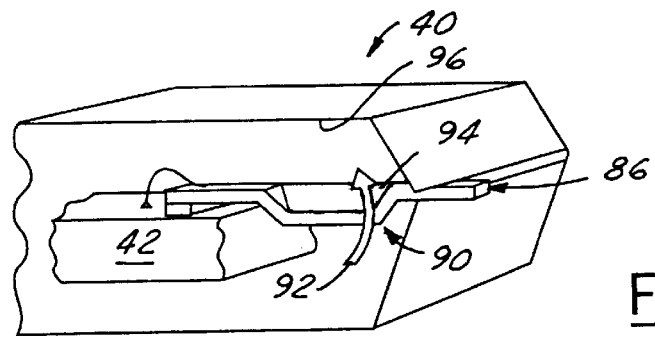
FIG. 2C is an enlarged, cross-sectional view of a present invention LOC package showing a lead finger tilted in a slope of about 45° to allow a higher flow velocity above the lead finger.
Figure 2D:
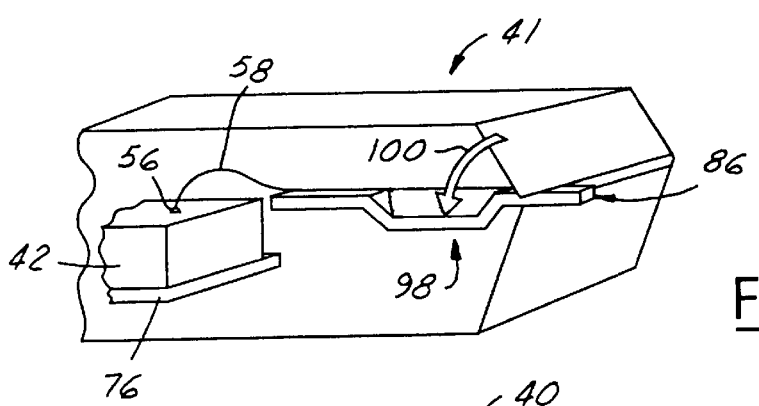
FIG. 2D is an enlarged, cross-sectional view of a present invention non-LOC package having a lead finger tilted in a 45° slope to allow a higher flow velocity below the lead finger.

In another embodiment, shown in FIG. 2C, a present invention LOC package 40 is constructed with lead finger 86 which has its horizontal plane tilted to a predetermined angle, i.e., approximately 45° in a deformed lead finger 90. An improved mold flow 92, as shown by the arrow in FIG. 2C is thus achieved for the flow channel above the lead finger 86, or the flow channel formed by the top surface 94 of the deformed lead finger 90 and the top mold interior surface 96. A variation of this embodiment is shown in FIG. 2D, wherein a deformed lead finger 98 is titled in a direction that points downwardly such that plastic flow 100 has an increased velocity and the amount of plastic material delivered is increased.

Figure 2E:
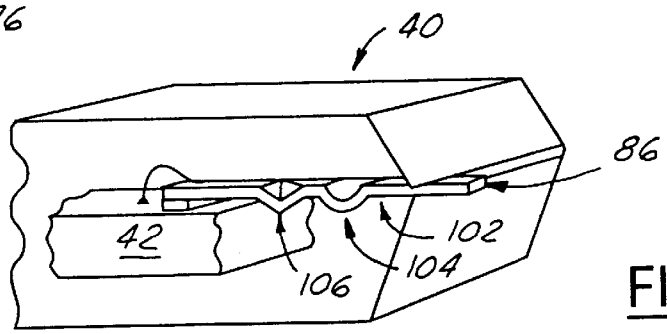
FIG. 2E is an enlarged, cross-sectional view of a present invention LOC package having a U-shaped and a V-shaped notch formed in the lead finger to facilitate plastic flow.

FIG. 2E illustrates another embodiment of the present invention wherein, in a deformed lead finger 102, a U-shaped notch 104 and a V-shaped notch 106 are provided to modify the flow passage above the lead finger 102. The deformation in the U-shaped notch 104 and the V-shaped notch 106 increases plastic flow through the notches and therefore, the amount of plastic material flown therethrough can be suitably adjusted by the position and the size of the notches.

Figure 3A:
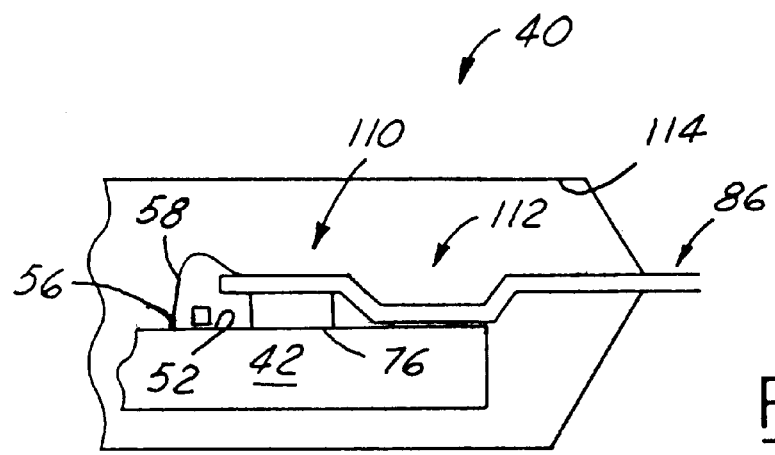
FIG. 3A is an enlarged, cross-sectional view of a present invention LOC package having a lead finger bonded to an IC chip and a U-shaped bend formed to improve plastic flow above the lead finger.

In still another embodiment of the present invention, as shown in FIG. 3A, the tip portion 110 is provided with a U-shaped bend 112 and is bonded to a top surface 52 of the chip 42 by adhesive tape 76. This configuration is necessary in applications where the tip portion of the finger leads must be bonded securely to an IC device before wire bonding can be carried out. In the configuration shown in FIG. 3A, the lead finger 86 normally has a thickness of about 0.005 in while the total thickness of the package is about 0.040 in. The ratio of the distance between the lead finger and the top mold surface and the distance between the lead finger and the bottom mold surface is about 1:3. The flow channel above the lead finger 86 must be enhanced to allow a higher velocity of flow therethrough and to prevent void formation in the upper part of the package at near the top surface 114.

Figure 3B:
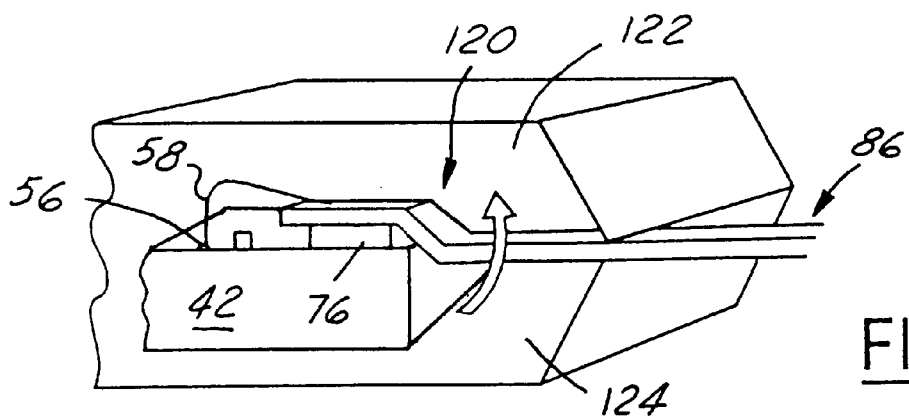
FIG. 3B is an enlarged, cross-sectional view of a present invention LOC package having a lead finger bonded to an IC chip to allow more plastic flow above the lead finger.

In still another preferred embodiment, as shown in FIG. 3B, a deformed portion 120 of the lead finger 86 is first bonded to the IC device 42 by an adhesive tape 76. To allow a higher plastic flow velocity, or a higher flow rate in the flow channel 122 above the lead finger 86 than in the flow channel 124 below the lead finger 86, the bend portion 120 is utilized to significantly open up the upper flow channel 122.

Figure 3C:
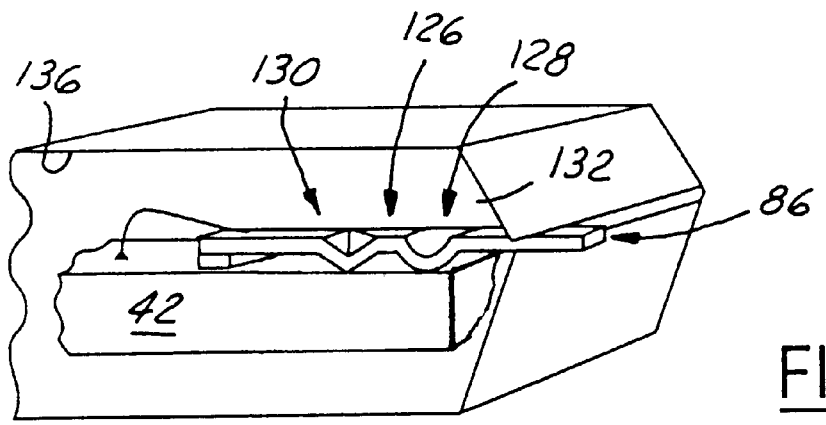
FIG. 3C is an enlarged, cross-sectional view of a present invention LOC package having a lead finger bonded to an IC chip with U-shaped and V-shaped notches in the finger to facilitate plastic flow above the finger.

Still another preferred embodiment of the present invention is shown in FIG. 3C, wherein a U-shaped channel 128 and a V-shaped channel 130 are provided in a deformed lead finger 126 such that a higher flow rate may be achieved in the flow channel 132 between the lead finger 86 and the top mold surface 136.

The present invention novel method has therefore been amply demonstrated in the above descriptions and in the appended drawings of FIGS. 2A~3C. It should be noted that while a number of embodiments of the present invention deformed lead fingers are shown in FIGS. 2A~3C, any suitable combinations of these embodiments can be utilized and furthermore, any other different configuration may be used as long as the flow rate can be modified by such configuration.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the invention.

The embodiment of the invention in which an exclusive property or privilege is claimed are defined as follows:

1. A method for balancing mold flow in encapsulating IC devices comprising the steps of:

providing a lead frame having a plurality of lead fingers emanating from an outer frame and extending inwardly away from said outer frame, deforming a portion of said lead fingers to be encapsulated in a plastic package by tilting a plane of the finger to about 45° toward a flow channel in which a plastic flow velocity is to be increased, positioning said lead frame and an IC device in a mold cavity, and injecting a plastic flow into said mold cavity for encapsulating said deformed lead fingers and said IC device.

2. A method for balancing mold flow in encapsulating IC devices according to claim 1, wherein said plurality of lead fingers are formed in the same plane as the outer frame.

3. A method for balancing mold flow in encapsulating IC devices according to claim 1, wherein said formation of voids is caused by trapped air.

4. A method for balancing mold flow in encapsulating IC devices according to claim 1, further comprising the step of deforming said lead fingers by forming a U-shaped bend in said lead fingers with an opening of the U facing a flow channel in which the plastic flow velocity is to be increased.

5. A method for balancing mold flow in encapsulating IC devices according to claim 1 further comprising the step of deforming said lead fingers by forming a V-shaped bend in said lead fingers with an opening of the V facing a flow channel in which the plastic flow velocity is to be increased.

6. A method for balancing mold flow in encapsulating IC devices according to claim 1 further comprising the step of deforming said lead fingers by forming a U-shaped notch in said lead fingers with an opening of the U facing a flow channel in which the plastic flow velocity is to be increased.

7. A method for balancing mold flow in encapsulating IC devices according to claim 1 further comprising the step of deforming said lead fingers by forming a V-shaped notch in said lead fingers with an opening of the V facing a flow channel in which the plastic flow velocity is to be increased.

8. An IC device encapsulated in a plastic package according to the method of claim 1.

9. A method for forming a plastic package of an electronic device without voids comprising the steps of:

providing a lead frame having an outer frame and a plurality of lead fingers, said lead fingers being formed substantially in the same plane as said outer frame, deforming a portion of said lead finger to be encapsulated in a plastic package by tilting a plane of the finger to about 45° toward a flow channel in which a plastic flow velocity is to be increased, positioning said lead frame with said deformed lead fingers and an electronic device in a mold cavity, and flowing a plastic flow into said mold cavity to encapsulate said deformed lead fingers and said electronic device, whereby said deformed lead fingers enables more balanced plastic flow to substantially eliminate the formation of voids.

10. A method for forming a plastic package of an electronic device without voids according to claim 9, wherein said electronic device and said deformed lead fingers are in electrical communication.

11. A method for forming a plastic package of an electronic device without voids according to claim 9 wherein said plurality of lead fingers emanating from said outer frame and extending inwardly away from said outer frame.

12. A method for forming a plastic package of an electronic device without voids according to claim 9 further comprising the step of deforming said lead fingers by forming a U-shaped bend in said lead fingers with an opening of the U facing a flow channel in which the plastic flow velocity is to be increased.

13. A method for forming a plastic package of an electronic device without voids according to claim 9 comprising the step of deforming said lead fingers by forming a V-shaped bend in said lead fingers with an opening of the V facing a flow channel in which the plastic flow velocity is to be increased.

14. A method for forming a plastic package of an electronic device without voids according to claim 9 further comprising the step of deforming said lead fingers by forming a U-shaped notch in said lead fingers with an opening of the U facing a flow channel in which the plastic flow velocity is to be increased.

15. A method for forming a plastic package of an electronic device without voids according to claim 9 comprising the step of deforming said lead fingers by forming a V-shaped notch in said lead fingers with an opening of the V facing a flow channel in which the plastic flow velocity is to be increased.

* * * * *